United States Patent
Refai-Ahmed

(10) Patent No.: US 8,058,724 B2
(45) Date of Patent: Nov. 15, 2011

(54) HOLISTIC THERMAL MANAGEMENT SYSTEM FOR A SEMICONDUCTOR CHIP

(75) Inventor: Gamal Refai-Ahmed, Markham (CA)

(73) Assignee: ATI Technologies ULC, Markham (CA)

( * ) Notice: Subject to any disclaimer, the term of this patent is extended or adjusted under 35 U.S.C. 154(b) by 67 days.

(21) Appl. No.: 11/948,124

(22) Filed: Nov. 30, 2007

(65) Prior Publication Data
US 2009/0140417 A1 Jun. 4, 2009

(51) Int. Cl.
*H01L 23/373* (2006.01)

(52) U.S. Cl. .......... 257/707; 257/706; 257/E23.08; 257/E23.082; 257/E23.097; 257/E23.111; 438/122

(58) Field of Classification Search .......... 257/625, 257/706, 707, 712, 713, 714, 171, 720, E33.075, 257/E31.131, E23.08, E23.082, E23.087, 257/E23.088, E23.097, E23.101, E23.103, 257/E23.105; 438/122, FOR. 413; 361/679.47, 361/688, 717, 704, 718, 719
See application file for complete search history.

(56) References Cited

U.S. PATENT DOCUMENTS

| | | | | |
|---|---|---|---|---|
| 5,008,737 A * | 4/1991 | Burnham et al. | | 257/712 |
| 5,112,775 A * | 5/1992 | Iida et al. | | 438/105 |
| 5,309,457 A * | 5/1994 | Minch | | 372/34 |
| 5,456,081 A * | 10/1995 | Chrysler et al. | | 62/3.7 |
| 5,637,921 A * | 6/1997 | Burward-Hoy | | 257/712 |
| 5,712,448 A * | 1/1998 | Vandersande et al. | | 136/203 |
| 5,880,524 A * | 3/1999 | Xie | | 257/704 |
| 6,002,081 A * | 12/1999 | Sakuragi | | 136/203 |
| 6,082,115 A | 7/2000 | Strnad | | |
| 6,100,199 A * | 8/2000 | Joshi et al. | | 438/694 |
| 6,127,619 A * | 10/2000 | Xi et al. | | 136/203 |
| 6,154,366 A | 11/2000 | Ma et al. | | |
| 6,164,076 A * | 12/2000 | Chu et al. | | 62/3.7 |
| 6,173,576 B1 | 1/2001 | Ishida et al. | | |
| 6,196,002 B1 | 3/2001 | Newman et al. | | |
| 6,281,120 B1 | 8/2001 | Strand | | |
| 6,288,321 B1 * | 9/2001 | Fleurial et al. | | 136/205 |
| 6,410,840 B1 | 6/2002 | Sudo et al. | | |
| 6,424,533 B1 * | 7/2002 | Chu et al. | | 361/719 |
| 6,429,137 B1 | 8/2002 | Ghoshal | | |
| 6,476,483 B1 | 11/2002 | Adler et al. | | |
| 6,485,191 B1 | 11/2002 | Sato | | |
| 6,559,538 B1 | 5/2003 | Pomerene et al. | | |
| 6,686,532 B1 * | 2/2004 | Macris | | 136/204 |
| 6,712,258 B2 * | 3/2004 | Ghoshal | | 228/134 |
| 6,800,933 B1 | 10/2004 | Mathews et al. | | |
| 6,942,018 B2 * | 9/2005 | Goodson et al. | | 165/80.4 |
| 6,946,363 B2 * | 9/2005 | Davidson | | 438/455 |

(Continued)

OTHER PUBLICATIONS

Emil Venere; *Tiny refrigerator taking shape to cool future computers*; http://news.uns.purdue.edu/x/2008a/080619GarimellaMinicool.html; Jun. 19, 2008; pp. 1-4.

(Continued)

*Primary Examiner* — Victor A Mandala
*Assistant Examiner* — William Harriston
(74) *Attorney, Agent, or Firm* — Timothy M. Honeycutt

(57) ABSTRACT

Various semiconductor chip thermal management systems and methods are disclosed. In one aspect, a method of manufacturing is provided that includes coupling a semiconductor chip to a substrate and coupling a diamond heat spreader that has a thermoelectric cooler to the semiconductor chip. A vapor chamber is coupled to the diamond heat spreader.

7 Claims, 4 Drawing Sheets

U.S. PATENT DOCUMENTS

| | | | | |
|---|---|---|---|---|
| 7,235,735 | B2 * | 6/2007 | Venkatasubramanian et al. | 136/203 |
| 7,367,195 | B2 * | 5/2008 | Sauciuc et al. | 62/3.3 |
| 7,396,735 | B2 * | 7/2008 | Nakanishi et al. | 438/408 |
| 7,436,059 | B1 * | 10/2008 | Ouyang | 257/712 |
| 7,671,466 | B2 * | 3/2010 | Pu et al. | 257/707 |
| 7,795,711 | B2 * | 9/2010 | Sauciuc et al. | 257/675 |
| 2001/0052652 | A1 * | 12/2001 | Smith et al. | 257/783 |
| 2002/0023733 | A1 * | 2/2002 | Hall et al. | 165/80.3 |
| 2003/0024698 | A1 * | 2/2003 | Bosak, III | 165/185 |
| 2003/0041892 | A1 * | 3/2003 | Fleurial et al. | 136/227 |
| 2004/0065880 | A1 * | 4/2004 | Hunt et al. | 257/48 |
| 2004/0118129 | A1 * | 6/2004 | Chrysler et al. | 62/3.2 |
| 2004/0196633 | A1 * | 10/2004 | Wong | 361/700 |
| 2004/0261988 | A1 * | 12/2004 | Sauciuc et al. | 165/185 |
| 2005/0134167 | A1 * | 6/2005 | Deguchi et al. | 313/491 |
| 2005/0211419 | A1 * | 9/2005 | Shih et al. | 165/104.26 |
| 2005/0274487 | A1 * | 12/2005 | Goth | 165/80.2 |
| 2006/0000500 | A1 * | 1/2006 | Sauciuc et al. | 136/201 |
| 2006/0004267 | A1 * | 1/2006 | Rule et al. | 600/310 |
| 2006/0011330 | A1 * | 1/2006 | Wang | 165/122 |
| 2006/0039111 | A1 * | 2/2006 | Huang | 361/698 |
| 2006/0107990 | A1 * | 5/2006 | Adachi et al. | 136/212 |
| 2006/0124165 | A1 * | 6/2006 | Bierschenk et al. | 136/212 |
| 2006/0127672 | A1 * | 6/2006 | Chrysler et al. | 428/408 |
| 2006/0137732 | A1 * | 6/2006 | Farahani et al. | 136/201 |
| 2006/0255452 | A1 * | 11/2006 | Wang et al. | 257/714 |
| 2007/0044483 | A1 * | 3/2007 | Refai-Ahmed et al. | 62/3.4 |
| 2007/0047211 | A1 | 3/2007 | Refai-Ahmed et al. | |
| 2007/0056621 | A1 * | 3/2007 | Baskaran | 136/201 |
| 2007/0068173 | A1 * | 3/2007 | Sauciuc et al. | 62/3.2 |
| 2007/0089773 | A1 * | 4/2007 | Koester et al. | 136/230 |
| 2007/0103646 | A1 * | 5/2007 | Young | 353/52 |
| 2007/0108595 | A1 * | 5/2007 | Refai-Ahmed | 257/706 |
| 2007/0125412 | A1 * | 6/2007 | Funahashi | 136/201 |
| 2007/0215194 | A1 * | 9/2007 | Bharathan et al. | 136/230 |
| 2007/0295496 | A1 * | 12/2007 | Hall et al. | 165/185 |
| 2008/0019406 | A1 * | 1/2008 | Abram et al. | 372/36 |
| 2008/0029145 | A1 * | 2/2008 | Sung | 136/239 |
| 2008/0043437 | A1 * | 2/2008 | Refai-Ahmed | 361/700 |
| 2008/0142195 | A1 * | 6/2008 | Erturk et al. | 165/94 |
| 2008/0155990 | A1 * | 7/2008 | Gupta et al. | 62/3.2 |
| 2008/0174963 | A1 * | 7/2008 | Chang et al. | 361/700 |
| 2008/0237844 | A1 * | 10/2008 | Aleksov et al. | 257/713 |
| 2008/0265404 | A1 * | 10/2008 | Furman et al. | 257/706 |
| 2008/0266800 | A1 * | 10/2008 | Lankston et al. | 361/700 |
| 2008/0271772 | A1 * | 11/2008 | Leonov et al. | 136/205 |
| 2008/0283222 | A1 * | 11/2008 | Chang et al. | 165/104.26 |
| 2008/0298021 | A1 * | 12/2008 | Ali et al. | 361/705 |
| 2009/0056917 | A1 * | 3/2009 | Majumdar et al. | 165/104.26 |
| 2009/0085198 | A1 * | 4/2009 | Vadakkanmaruveedu et al. | 257/714 |
| 2009/0109611 | A1 * | 4/2009 | Anderl et al. | 361/679.47 |
| 2009/0294117 | A1 * | 12/2009 | Hodes et al. | 165/287 |

OTHER PUBLICATIONS

Ehud Rattner; *Refrigerator Cools Future Computers*; http://thefutureofthings.com/news/1252/refrigerator-cools-future-computer; Jul. 23, 2008; pp. 1-3.

Victor Rudometov et al.; *Peltier coolers* (http://www.digit-life.com/articles/peltiercoolers/); pp. 1-9; 2000.

Tillman Steinbrecher; *The Heatsink Guide:Peltier coolers* (http://www.heatsink-guide.com/peltier.htm); pp. 1-5; Mar. 23, 2001.

Mr. Sengebusch; *Mirco peltier elements* (http://www.peltierelement.com/english/peltierelement/micro.html); pp. 1-3; Jul. 12, 2000.

David L. Saums et al.; *Diamond Pins Utilized as Thermal Vias for High Heat Flux Spreading in CTE-Compatible Lids and Substrates for Semiconductor Packaging*; 22nd IEEE SEMI-THERM Symposium; Feb. 13, 2006; pp. 1-11.

Nextreme, Inc.; *Thermal Management Applications web page*; http://www.nextreme.com/pages/applications/ic_thermal.html; 2005; p. 1 of 1.

Nextreme, Inc.; *Cooling Hot Spots on High-Performance CMOS ICs*; Sep. 10, 2006; pp. 1-12.

Steve Hamm;*IBM's Chip Breakthrough: Big Blue's new chipmaking process allows for a major speed increase, as well as significant power savings*; Business Week Magazine; May 2007.

\* cited by examiner

HOLISTIC THERMAL MANAGEMENT SYSTEM FOR A SEMICONDUCTOR CHIP

BACKGROUND OF THE INVENTION

1. Field of the Invention

This invention relates generally to semiconductor processing, and more particularly to methods and apparatus for managing heat in a semiconductor chip.

2. Description of the Related Art

Heat is an adversary of most electronic devices. Integrated circuits, such as various types of processors, can be particularly susceptible to heat-related performance problems or device failure. Over the years, the problem of cooling integrated circuits has been tackled in a variety of ways. For conventional plastic or ceramic packaged integrated circuits, cooling fans, heat fins and even liquid cooling systems have been used, often with great success.

In the past few years, the size and power consumption of integrated circuits has climbed to the point where designers have turned to other ways to shed heat. One of these conventional techniques involves a liquid coolant micro heat exchanger in which a coolant is circulated past a top surface of an semiconductor chip. Another conventional technique for more localized thermal management involves the use of a thermoelectric or Peltier device. Conventional Peltier devices have been incorporated directly into a semiconductor die or supplied as an add on. In another conventional design suitable for a packaged semiconductor chip with a lid, micro channels are formed in the lid to increase the surface area available for conductive heat transfer. In still another conventional variant, a plate is coupled to a semiconductor die. The plate is provided with several diamond pins that act as heat pipes for the transfer of heat away from the semiconductor die.

The aforementioned conventional designs tend to focus on specific device and heat transfer levels, i.e., microscopic, macroscopic etc. New varieties of integrated circuits dissipate up to a few hundred watts of power. With die sizes continuing to fall, power densities can reach over a thousand watts per square centimeter. Conventional cooling systems may not be able to manage such power levels.

The present invention is directed to overcoming or reducing the effects of one or more of the foregoing disadvantages.

SUMMARY OF THE INVENTION

In accordance with one aspect of the present invention, a method of manufacturing is provided that includes coupling a semiconductor chip to a substrate and coupling a diamond heat spreader that has a thermoelectric cooler to the semiconductor chip. A vapor chamber is coupled to the diamond heat spreader.

In accordance with another aspect of the present invention, a method of manufacturing is provided that includes coupling a semiconductor chip to a substrate and coupling a vapor chamber to the semiconductor chip. The vapor chamber has a body with an internal chamber for holding a cooling fluid. The body includes at least one diamond member proximate the semiconductor chip.

In accordance with another aspect of the present invention, an apparatus is provided that includes a substrate, a semiconductor chip coupled to the substrate, and a diamond heat spreader coupled to the semiconductor chip. A thermoelectric cooler is positioned in the diamond heat spreader. A vapor chamber is coupled to the diamond heat spreader.

In accordance with another aspect of the present invention, an apparatus is provided that includes a substrate, a semiconductor chip coupled to the substrate and a vapor chamber coupled to the semiconductor chip. The vapor chamber has a body with an internal chamber for holding a cooling fluid. The body includes at least one diamond member proximate the semiconductor chip.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
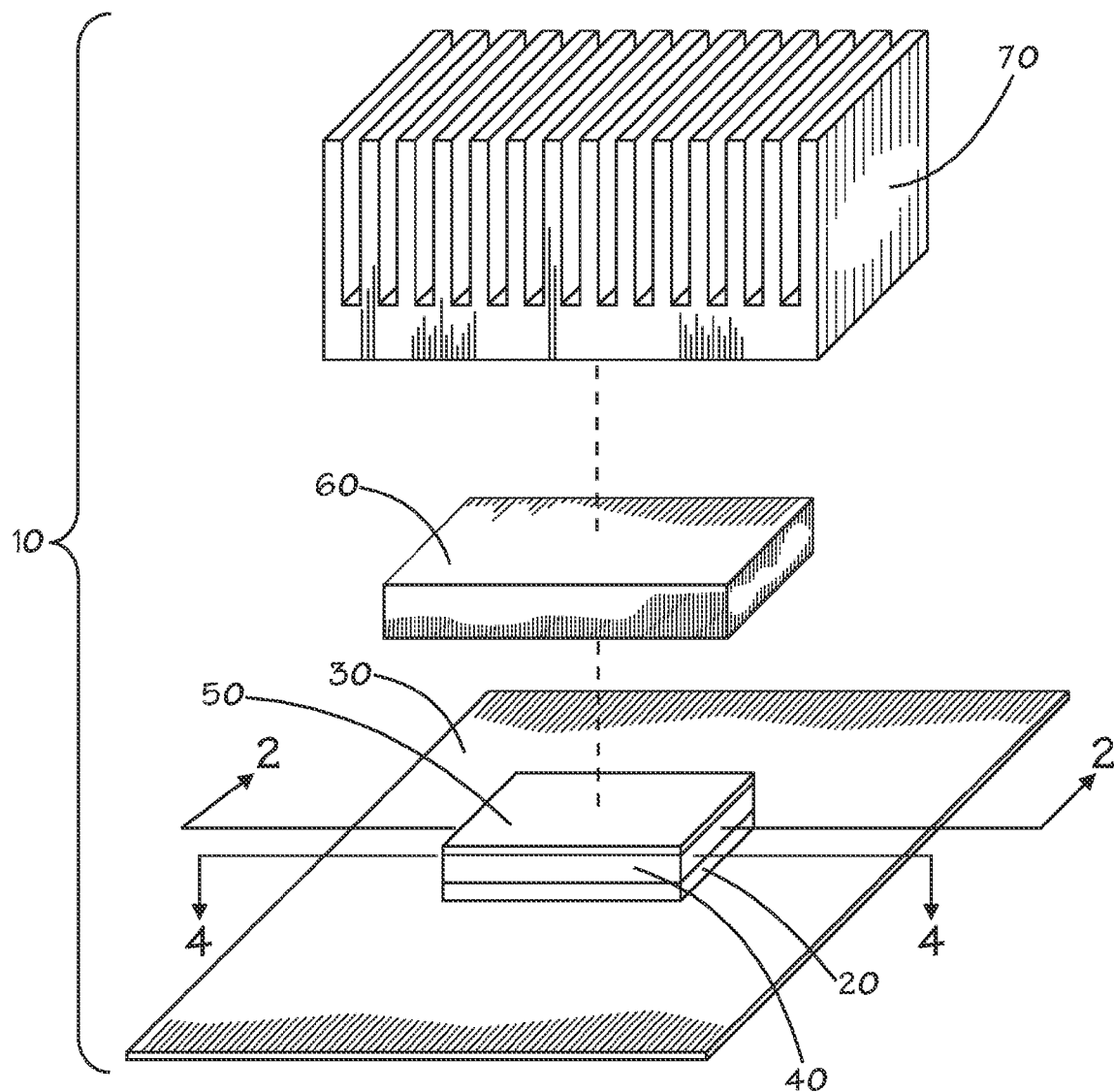
FIG. 1 is a partially exploded pictorial view of an exemplary embodiment of a semiconductor chip system.

In the drawings described below, reference numerals are generally repeated where identical elements appear in more than one figure. Turning now to the drawings, and in particular to FIG. 1, therein is shown a partially exploded pictorial view of an exemplary embodiment of a semiconductor chip system 10 that includes a semiconductor chip or device 20 mounted to a substrate 30. A heat spreader 40 is coupled to the semiconductor chip 20. A thermal interface 50 is positioned on the heat spreader 40. A vapor chamber 60 is normally positioned on the thermal interface 50, but is shown exploded from the nano foil 50 in FIG. 1. Finally, another heat spreader 70 is normally positioned on the vapor chamber 60, but is shown exploded from the vapor chamber 60 in FIG. 1. The combination of the heat spreader 40, the thermal interface 50, the vapor chamber 60 and the heat spreader 70 provides a multi-prong solution to transferring heat away from the semiconductor chip 20.

Figure 2:
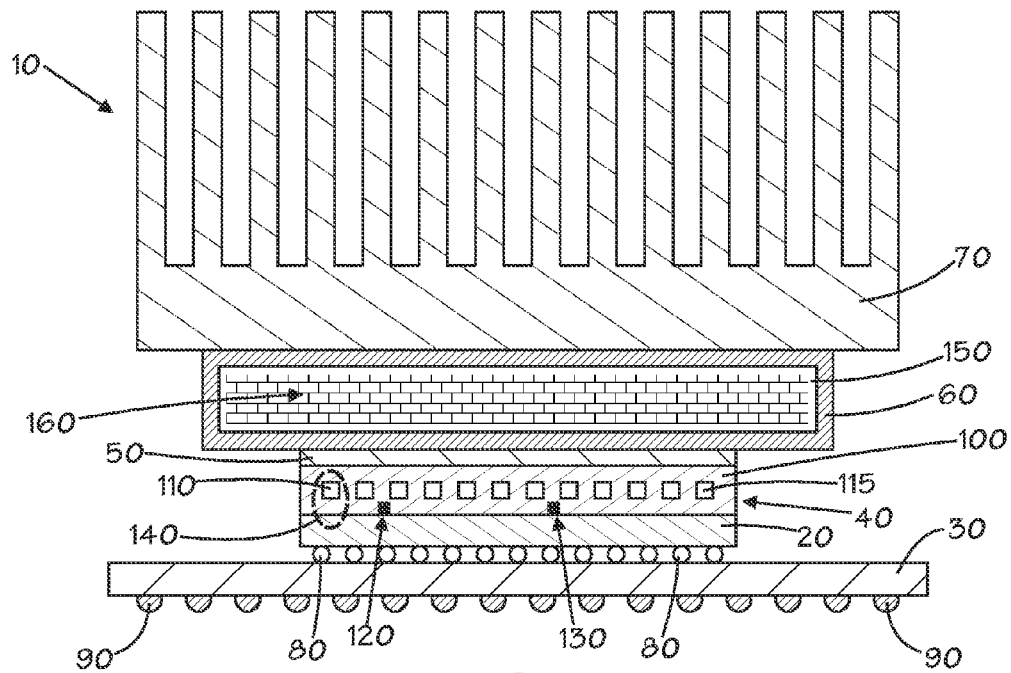
FIG. 2 is a sectional view of FIG. 1 taken at section 2-2.

Additional detail regarding the semiconductor chip system 10 may be understood by referring now to FIG. 2, which is a sectional view of FIG. 1 taken at section 2-2. The semiconductor chip 20 is mounted on the base substrate 20 and may be any of a myriad of different types of circuit devices used in electronics, such as, for example, microprocessors, graphics processors, application specific integrated circuits, memory devices or the like, and may be single or multi-core. Optionally, the semiconductor chip 20 may be an active optical device, such as a diode laser. The semiconductor chip 20 may be composed of silicon, germanium or the like and may be bulk semiconductor or semiconductor-on-insulator. The semiconductor chip 20 is shown flip-chip mounted to the substrate 30 and electrically interconnected therewith by way of a plurality of conductor structures 80 which are depicted as small white ovals. The conductor structures 80 may be solder bumps or balls, conductive pillars of copper or other conductive materials used with or without solder or the like. An optional underfill material (not shown) may be disposed between the semiconductor chip 20 and the substrate 30.

The substrate 30 may interconnect electrically with external devices, such as another circuit board, in a variety of ways.

In the exemplary embodiment, a ball grid array consisting of a plurality of conductor balls 90 projects from the substrate 30. The substrate 30 includes electrical interconnects that are not visible but are present to establish electrical connectivity between the array of balls 90 and the conductor structures 80. Optionally, a pin grid array, a land grid array or some other type of interconnect configuration may be used. The substrate 30 may be formed from polymeric materials, ceramic materials or the like. The substrate 30 may actually consist of multiple layers of metallization and dielectric materials that electrically interconnect the conductor balls 90 to various portions of the integrated circuit 20 by way of the conductors 80. The number of individual layers is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill.

The heat spreader 40 may be a body 100 composed of diamond and interspersed with several channels, two of which are labeled 110 and 115. Diamond provides excellent conductive heat transfer properties. A cooling fluid may be placed in the channels 110 and 115, etc., to provide a convective heat transfer capability for the spreader 40. The fluid may be water, glycol or the like. The coolant may be circulated by natural or forced convection. One or more thermoelectric coolers 120 and 130 may be embedded in the body 100. A portion of the body 100 of the heat spreader 40 that includes the channel 110 as well as a small portion of the semiconductor chip 20 are circumscribed by a dashed oval 140. The area circumscribed by the dashed oval 140 will be described in conjunction with and shown in a subsequent figure.

The thermal interface 50 is designed to provide a uniform and low thermal resistance pathway between the heat spreader 40 and the vapor chamber 60. The thermal interface 50 may be composed of various solder materials, such as tin-based solders with or without lead, indium solder or the like. In another variant, a soldering enhancer may be used to serve as electrical and/or thermal stimuli as an energy-activated local heat source melting solder on either side of a foil and bonding the two soldering components on each side at lower temperatures. A commercial example of the energy-activated soldering enhancer in the form of a foil is Nano-Foil® manufactured by Reactive NanoTechnologies Inc. The NanoFoil® consists of nanotubes of nickel and aluminum in a multilayer arrangement. The use of the electrical soldering enhancer allows for the change or optimization of the type of solder used. In the commercial product previously disclosed, NanoFoil® allows for the replacement of lead and tin solder with gold and tin solder, which in turn allows for subsequent reflow steps without degradation in bonding.

The vapor chamber 60 advantageously includes an interior chamber 150 that may be provided with a mesh structure 160 or an optional set of micro channels that are designed to provide both a large surface area for heat transfer as well as facilitate the movement of a fluid in the chamber 150 by way of capillary action and/or natural convection. The fluid in the chamber 150 may be water, glycol or the like.

The heat spreader 70 may be seated on the vapor chamber 60 and an optional thermal interface material (not shown) may be interposed between the heat spreader 70 and the vapor chamber 60. The heat spreader 70 can take on a myriad of configurations and may include fluid cooling in the form of liquid circulation and air flow or combinations of both if desired.

Figure 3:
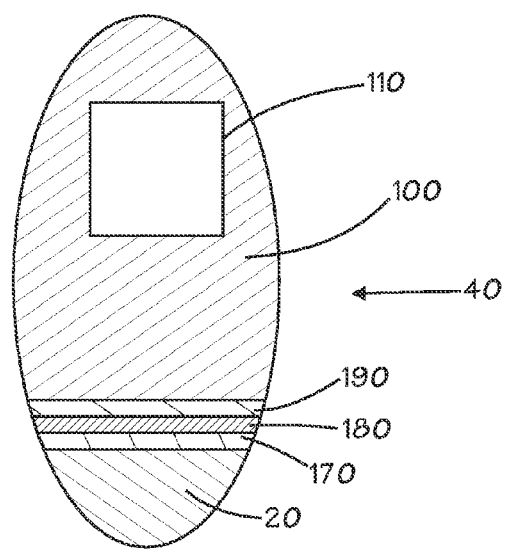
FIG. 3 is a magnified view of a selected portion of FIG. 2.

An exemplary interface between the heat spreader 40 and the semiconductor chip 20 will be described now in conjunction with FIG. 3, which is a magnified view of the portion of FIG. 2 circumscribed by the dashed oval 140. As noted above, the circumscribed portion includes the flow channel 110 that is situated in the body 100 of the heat spreader 40. A small portion of the semiconductor chip 20 is also visible. In order to establish a mechanical connection between the diamond body 100 and the semiconductor chip 20, several layers are interposed in between the body 100 and the semiconductor chip 20. A layer 170 positioned on the semiconductor chip 20 may consist of a wettable metal layer that is composed of, for example, gold or the like. A layer 180 composed of solder materials, such as indium or the like, is positioned on the layer 170. A layer 190 positioned on the layer 180 may consist of a wettable metal layer that is composed of, for example, gold or the like. To establish the connection between the heat spreader body 100 and the semiconductor chip 20, the chip 20 and the body 100 are first provided with the layers 170 and 190, respectively. Thereafter, the solder layer 180 is applied either to the chip 20 or the heat spreader body 100 and the heat spreader body 100 and the chip 20 are brought together and a thermal reflow process is performed to reflow the solder layer 180 and thereby establish a metallurgical bond. In another option, the NanoFoil® discussed elsewhere herein may be used between the layers 170 and 190. In still another option, well-known optical bonding may be used to couple the diamond spreader 40 to the semiconductor chip 20.

Figure 4:
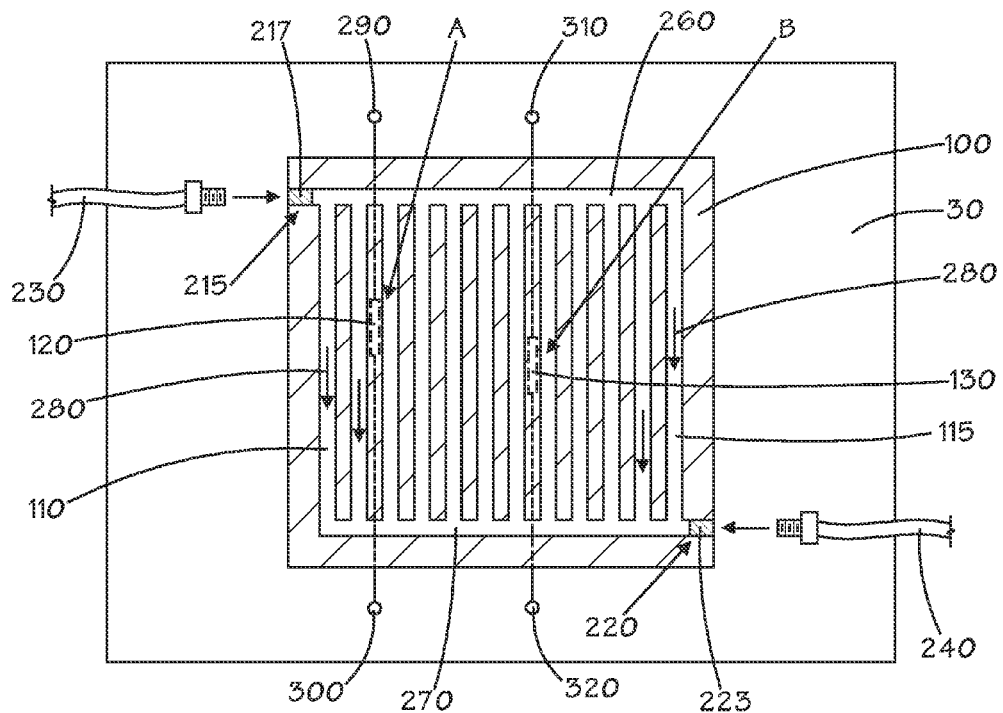
FIG. 4 is a sectional view of FIG. 1 taken at section 4-4.

Additional detail regarding the heat spreader 40 may be understood by referring now to FIG. 4, which is a sectional view of FIG. 1 taken at section 4-4. The aforementioned channels, two of which are labeled 110 and 120 are now shown in section in FIG. 4. As noted above, the channels may be provided with a cooling fluid that is circulated by natural convection. In this regard an inlet port 215 may be sealed with a plug 217 and an outlet port 220 may be sealed with a plug 223. Optionally, a forced convection scheme may be used in which the plug 217 may be removed and a supply line 230 connected to the port 215 and the plug 223 may be removed and a return line 240 connected to the port 220. The channels 110, 120, etc. may be configured to commonly connect to a supply manifold 260 and a return manifold 270 as shown in FIG. 4. However, something other than a manifold design may be used as desired. Thus, when the supply line 230 and the return line 240 are connected to the body 100, and a pumping apparatus (not shown) is activated, fluid will flow as indicated by the arrows 280 through the body 100 and out the return line 240.

The thermoelectric coolers 120 and 130 that were shown in section in FIG. 2, are shown in phantom in FIG. 4 as those components are concealed beneath portions of the body 100 of the heat spreader 40 in FIG. 4. The thermoelectric cooler 120 may be provided with electrical taps 290 and 300. A DC voltage source (not shown) may be connected to the taps 290 and 300 to bias the thermoelectric cooler 120. The thermoelectric cooler 130 may be similarly provided with electrical taps 310 and 320. The thermoelectric coolers 120 and 130 may be configured as nano structure Peltier devices, with or without multiple junctions, that utilize very fine gauge wires. The thermoelectric cooler 120 may be located at a position, A, and the thermoelectric cooler 130 may be located at a position, B, where positions A and B may be selected based on anticipated hot spots of the underlying semiconductor chip 20 (see FIGS. 1 and 2). The skilled artisan will appreciate that a thermal map of the semiconductor chip (see FIGS. 1 and 2) may be used to select the desired locations for the thermoelectric coolers 120 and 130 that provide the closest proximity to the anticipated hot spots and thus a more efficient cooling effect.

Figure 5:
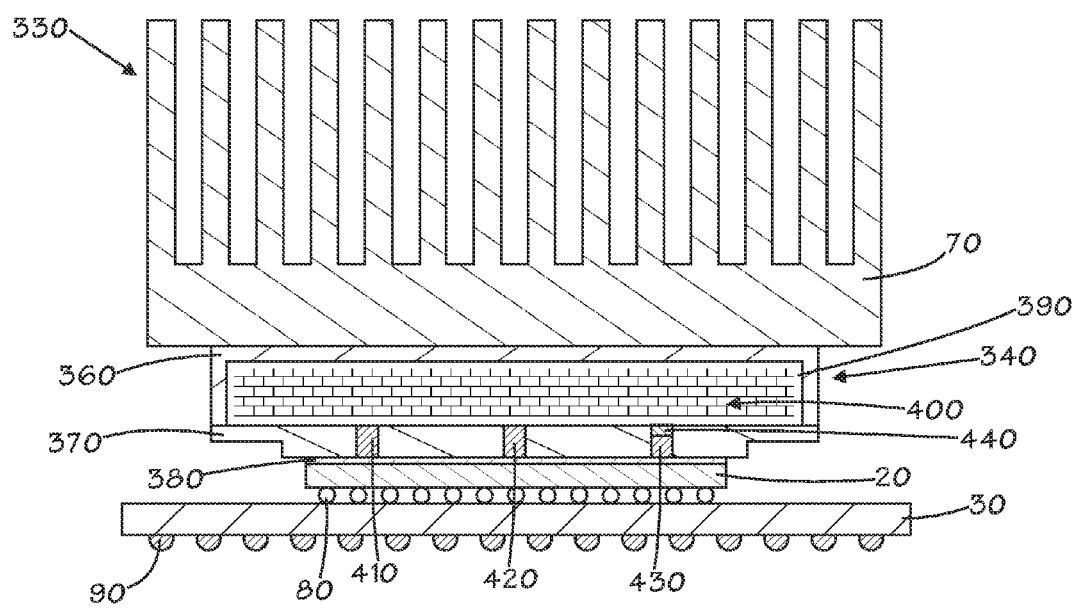
FIG. 5 is a sectional view like FIG. 2 but of an alternate exemplary embodiment of a semiconductor chip system.

An alternate exemplary embodiment of a semiconductor chip system 330 may be understood by referring now to FIG. 5, which is a sectional view like FIG. 2. FIG. 5 shows the semiconductor chip 20 mounted to the substrate 30 and provided with the aforementioned interconnects 80. The substrate 30 may be provided with the aforementioned interconnects 90 as described elsewhere herein. The heat spreader 70 may be provided as described elsewhere herein. In this illustrative embodiment, a vapor chamber 340 is provided between the heat spreader 70 and the semiconductor chip 20. The vapor chamber 340 may consist of a body that has an upper shell 360 that is seated on a bottom plate 370. A thermal interface material layer 380 may be interposed between the bottom plate 370 and the semiconductor chip 20. The thermal interface material layer 380 may be composed of indium, NanoFoil®, organic thermal pastes, liquid metals or the like. The shell 360 of the vapor chamber 340 defines an interior chamber 390 that may be provided with a structure 400 that may be mesh-like or consist of a plurality of channels that are designed to provide both a large surface area for heat transfer as well as facilitate the movement of a fluid in the chamber 390 by way of capillary action and/or natural convection. The fluid in the chamber 390 may be water, glycol or the like. The shell 360 may be composed of copper, nickel, nickel jacketed copper or the like. The bottom plate 370 may be composed of copper, aluminum, palladium, alloys of these or the like.

To facilitate the transfer of heat from a semiconductor chip to the vapor chamber 340, the bottom plate 370 may be provided with one or more diamond members or pins, three of which are shown and labeled 410, 420 and 430 respectively. Any or all of the pins 410, 420 and 430 may be provided with a thermoelectric cooler. In an exemplary embodiment, the pin 430 is provided with a thermal electric cooler 440 that may be configured as generally described elsewhere herein. The diamond pins provide exceptionally low thermal resistance pathways for heat transfer between portions of the semiconductor chip 20 and the vapor chamber 340. It is anticipated that the pins 410, 420 and 430 may be deposited in bores in the plate 380 by chemical vapor deposition or other well-known techniques.

Figure 6:
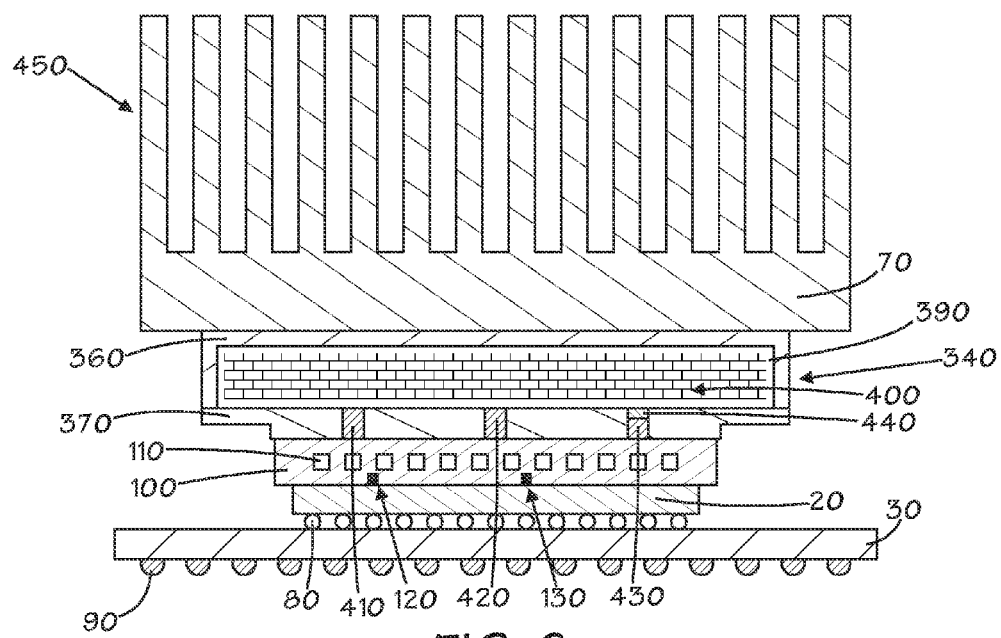
FIG. 6 is a sectional view like FIG. 5, but of another alternate exemplary embodiment of a semiconductor chip system.

In another alternate exemplary embodiment depicted in FIG. 6, a semiconductor chip system 450 is disclosed in which a semiconductor chip is provided with both a diamond heat spreader and a vapor chamber that includes diamond pins. FIG. 6 is a sectional view like FIG. 5 and depicts the semiconductor chip 20 coupled to the substrate 30 and provided with the corresponding pluralities of interconnect structures 80 and 90 as disclosed elsewhere herein. The diamond heat spreader 40 as generally described elsewhere herein may be provided between the semiconductor chip and an overlying vapor chamber 340, which may be configured substantially as described above in conjunction with FIG. 5. In this regard, the heat spreader 40 may include a diamond body 100 that is interspersed with a plurality of channels, two of which are labeled 110 and 115, as well as one or more thermoelectric coolers 120 and 130. The vapor chamber 340 may be provided with an upper shell 360 seated on a lower base plate 370 that collectively define an internal chamber 390 that may be provided with the aforementioned mesh or micro channel structure 400. The base plate 370 may be provided with the aforementioned diamond pins 410, 420 and 430 with the pin 430 including a thermoelectric cooler 440 as described elsewhere herein. The heat spreader 70 may also be used as described elsewhere herein.

Figure 7:
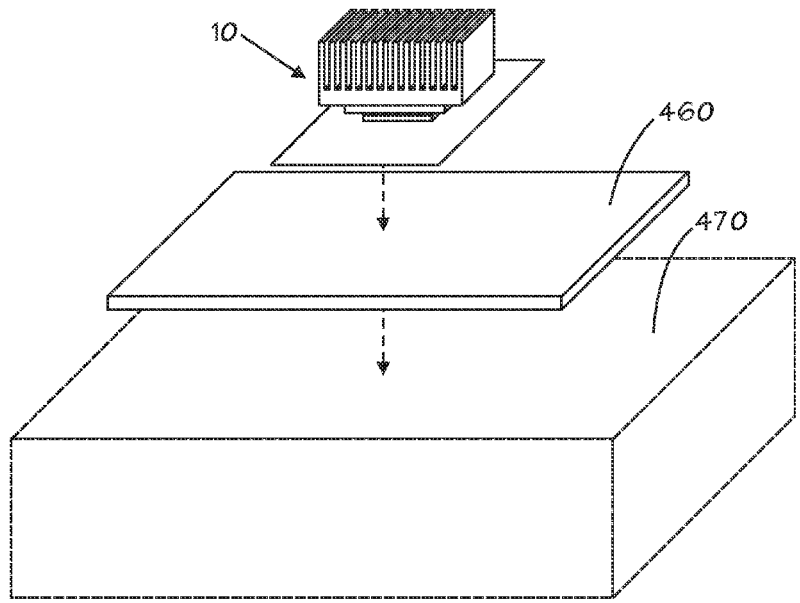
FIG. 7 is a partially exploded pictorial view of an exemplary embodiment of a computing device incorporating the semiconductor chip system.

The semiconductor chip systems disclosed herein may be mounted to other devices in a variety of ways. FIG. 7 depicts an exploded pictorial view of a few exemplary mounting possibilities. The semiconductor chip system 10 may be mounted on a substrate 460. The substrate 460 may be a printed circuit board or other type of substrate. For example, the substrate 460 may be a motherboard for a computer system. The semiconductor chip system 10 may be included in a larger system, such as a computing device represented by the dashed box 470. The computing device 480 may be, for example, a digital television, a handheld mobile device, a personal computer, a server, a memory device, an add-in board such as a graphics card, or any other computing device employing semiconductors.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   coupling a semiconductor chip to a substrate;
   coupling a diamond heat spreader to the semiconductor chip, the diamond heat spreader including a body having a plurality of internal channels containing a fluid and a thermoelectric cooler embedded in and in direct thermal contact with the body; and
   coupling a vapor chamber to the diamond heat spreader.

2. The method of claim 1, comprising coupling a heat spreader to the vapor chamber.

3. An apparatus, comprising:
   a substrate;
   a semiconductor chip coupled to the substrate;
   a diamond heat spreader coupled to the semiconductor chip and including a plurality of internal channels;
   a thermoelectric cooler embedded in and direct thermal contact with the diamond heat spreader; and
   a vapor chamber coupled to the diamond heat spreader.

4. The apparatus of claim 3, wherein the vapor chamber comprises a plurality of internal channels.

5. The apparatus of claim 3, comprising a heat spreader coupled to the vapor chamber.

6. The apparatus of claim 3, comprising a computing device coupled to the substrate.

7. The method of claim 1, comprising coupling a computing device to the substrate.

* * * * *